United States Patent [19]
Moore

[11] Patent Number: 5,790,376
[45] Date of Patent: Aug. 4, 1998

[54] HEAT DISSIPATING PAD STRUCTURE FOR AN ELECTRONIC COMPONENT

[75] Inventor: David A. Moore, Tomball, Tex.

[73] Assignee: Compaq Computer Corporation, Houston, Tex.

[21] Appl. No.: 744,624

[22] Filed: Nov. 6, 1996

[51] Int. Cl.$^6$ ...................................................... H05K 7/20
[52] U.S. Cl. .......................... 361/700; 165/80.4; 165/185;
174/15.1; 174/16.3; 257/715; 361/704;
361/715
[58] Field of Search .................................. 165/80.2, 80.4,
165/185; 174/15.1, 16.3; 257/707, 713,
714, 715; 361/687, 698–699, 700–702,
704, 707, 719–721

[56] References Cited

U.S. PATENT DOCUMENTS

| 4,204,246 | 5/1980 | Arii et al. | 361/702 |
| 5,513,070 | 4/1996 | Xie et al. | 361/687 |

FOREIGN PATENT DOCUMENTS

| 3242997 | 10/1991 | Japan | 361/720 |

Primary Examiner—Gregory D. Thompson
Attorney, Agent, or Firm—Konneker & Smith, P.C.

[57] ABSTRACT

Heat generated by a processor within the base housing portion of a notebook computer is received, spread, and dissipated through an exterior wall of the housing by a heat transfer pad structure in which a spaced series of porous plastic tube members, each having a quantity of purified water therein, are individually and sealingly encapsulated in partially evacuated pocket areas formed between two facing sheets of a high temperature polyimide film material. A metal heat receiving block member is positioned between and contacts the processor and a portion of one side of the pad structure, with the opposite side of the pad structure contacting the exterior housing wall. Heat generated by the processor is conducted through the metal block and into first longitudinal portions of the porous, liquid containing tubes which responsively function as thermosyphoning heat pipes to spread the received heat along the pad structure away from the heat receiving block and dissipate the heat into the exterior housing wall for transfer to ambient, thereby substantially reducing the creation of thermal hot spots on the housing during computer operation.

40 Claims, 1 Drawing Sheet

HEAT DISSIPATING PAD STRUCTURE FOR AN ELECTRONIC COMPONENT

BACKGROUND OF THE INVENTION

1. Field of the Invention

The present invention relates generally to apparatus for cooling heat generating electronic components, such as computer processors, and, in a preferred embodiment thereof, more particularly relates to a heat pipe-based heat dissipation pad structure for use with a heat generating electronic component.

2. Description of Related Art

As small portable computers, such as the increasingly popular notebook computer, have become faster and more powerful their internally generated operating heat needing to be dissipated has correspondingly increased to the extent that adequate heat dissipation has become a major design concern in these more powerful compact computing devices.

The primary heat generating components in notebook computers, such as the processor, power supply, hard drive and the like, are typically disposed in the base housing portion of the computer to which the display screen-carrying lid housing portion is pivotally secured for movement relative thereto between open and closed positions. With the continuing trend toward higher power densities in electronic equipment, particularly in the case of microprocessor devices such as computers, temperature control becomes critical to successful system design.

Portable notebook computers, due to their combination of high operating heat generation and low volume, have proven to present particularly difficult design problems from an overall heat dissipation standpoint. Higher capacity batteries, higher bus speeds, integrated AC adapters, and greater expandability have combined to increase heat generation in notebook computers while at the same time their volume continues to shrink.

As a result of these trends, the external surface temperatures of notebook computers have been rising a phenomenon that may be readily perceived by computer end users as a poor design. Frequently, the area directly adjacent major heat generating computer components such as microprocessors or power supplies can develop concentrated hot spots within the computer housing.

In an effort to eliminate the creation of corresponding hot spots on the exterior surface of the computer housing, various techniques have been previously proposed to "spread" the concentrated heat over a large housing surface area to thereby reduce the maximum housing temperature that may be felt by a user of the computer. These previously proposed techniques have representatively included (1) solid metal heat spreaders, (2) copper tube heat pipe elements with separately formed input and output heat exchangers; and (3) metal heat sinks with associated forced convection fans.

None of these previously proposed heat spreading structures has proven to be entirely satisfactory. For example, solid metal heat spreaders are heavy, consume an undesirably large volume within the computer housing, and are not very effective at transmitting heat over long distances. Copper heat pipes, operative under a thermosyphon heat transfer mode, are costly, thick, and are typically more suited to transfer heat over long distances through generally linear paths than to spread heat along a generally planar path. Metal heat sinks with associated cooling fans are costly, not particularly efficient from a heat dissipation standpoint, and have moving parts subject to wear.

In view of the foregoing it can be readily seen that it would be highly desirable to provide improved heat dissipation and spreading apparatus, for use in conjunction with a heat generating electronic component such as those found in a computer, which eliminates or at least substantially reduces the above-mentioned problems, limitations and disadvantages typically associated with conventional heat dissipation and spreading apparatus of the type generally described above. It is accordingly an object of the present invention to provide such improved heat dissipation and spreading apparatus.

SUMMARY OF THE INVENTION

In carrying out principles of the present invention, in accordance with a preferred embodiment thereof, apparatus for receiving heat from a heat generating object in a first portion thereof, and spreading and dissipating the received heat through and from a second portion thereof is provided. The apparatus is representatively utilized to receive, spread and dissipate operating heat from a processor or other heat generating component disposed within the base housing portion of a notebook computer and comprises a specially designed pad structure.

The pad structure is preferably of a flexible construction and includes a spaced plurality of hollow tubular members each being formed from a wicking material such as porous plastic and having a quantity of a heat transfer fluid, representatively purified water, therein. The pad structure also includes a pad body formed from a flexible sheet material, representatively a high temperature polyimide film material, and having a plurality of sealed pocket areas formed therein. Each of the sealed pocket areas receives a different one of the hollow tubular members and is at least partially evacuated in a manner holding the flexible sheet material exteriorly against the hollow tubular member in configurational conformance with its exterior shape.

In a preferred embodiment of the invention, a metal heat receiving block contacts the processor and a portion of one side of the pad structure, with the opposite side of the pad structure in contact with the exterior computer housing wall. Representatively, the pad side of the metal block has a spaced series of indentations formed therein and complementarily receiving lateral portions of the tubular members.

Heat from the processor is conducted through the metal block into first longitudinal portions of the tubular members, vaporizing water (or other heat transfer liquid as the case may be) carried in the walls of such longitudinal tube portions. By a thermosyphoning action, the vaporized liquid is forced through the hollow interiors of second longitudinal tube portions while transferring its received heat outwardly through the tubes and the pad body to the exterior housing wall for dissipation to ambient. The now cooled vapor condenses, is absorbed in the adjacent porous tube wall portions, and is wicked by capillary action back to the first longitudinal tube portions to pick up additional processor heat and repeat the above described thermosyphoning heat spreading and dissipation process.

The flexible pad structure is representatively fabricated by the steps of placing the hollow tubular members in the pad body pockets, placing the heat transfer fluid in the tubular members, sealingly encapsulating the hollow tubular members within the pocket areas, and creating at least partial vacuums in the pocket areas. In one fabrication method, the vacuum-creating step is performed prior to the sealingly encapsulating step. In another fabrication method the method comprised the further step of heating the hollow tubular members, the quantities of heat transfer fluid and the pad body prior to performing the sealingly encapsulating step, and the vacuum-creating step is performed after the sealingly encapsulating step by permitting the heated hollow tubular member, quantities of heat transfer fluid and pad body to cool.

DETAILED DESCRIPTION

Figure 1:
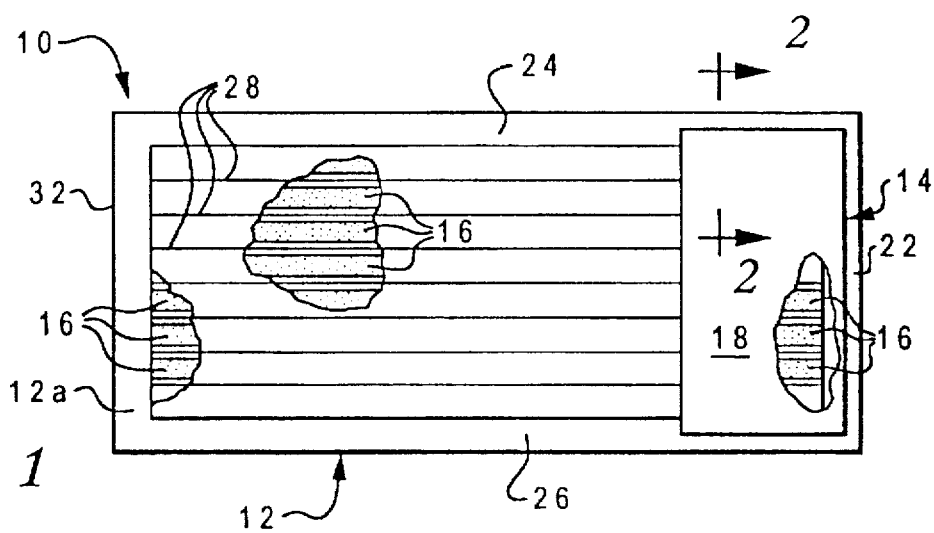
FIG. 1 is a partially cut away top plan view of a heat dissipation pad structure, and an associated heat receiving member, embodying principles of the present invention.
Figure 2:
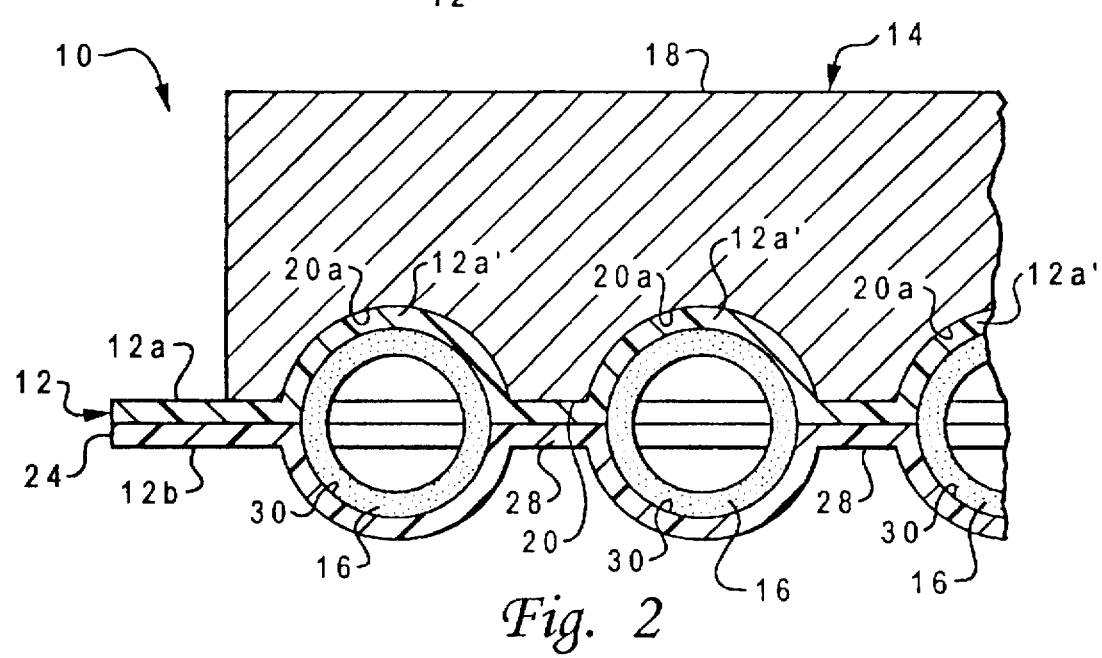
FIG. 2 is an enlarged scale partial cross-sectional view through the heat dissipation pad structure taken along line 2—2 of FIG. 1.

Illustrated in somewhat simplified form in FIGS. 1 and 2 is a specially designed heat dissipation and spreading apparatus 10 that embodies principles of the present invention and is used, as later described herein, to economically and efficiently remove heat from a heat-generating electronic component used, for example, in a portable notebook computer.

Apparatus 10 includes a specially designed flexible heat spreading pad structure 12, and an associated metal heat receiving block 14 which is preferably formed from aluminum. The body section of pad structure 12 representatively has a rectangular configuration, elongated in a left-to-right direction in FIG. 1, and is formed from upper and lower layers 12a,12b of a suitable high temperature flexible film material such as the high temperature polyimide film material manufactured by the DuPont Company under the tradename "KAPTON".

Individually and sealingly encapsulated between the upper and lower film layers 12a,12b are a spaced series of parallel, hollow, open-ended heat pipe tubes 16. Each heat pipe tube 16 is formed from a porous material. Preferably, the porous material is a nonmetallic material such as a suitable plastic material.

As best illustrated in FIG. 2, the metal heat receiving block 14 representatively has a rectangular configuration with top and bottom side surfaces 18 and 20. The block 14 representatively rests atop a right end portion of the pad structure 12 and has spaced apart arcuate depressions 20a formed in its bottom side surface 20 and configured to complementarily receive correspondingly curved sections 12a' of the upper film layer 12a as indicated.

In fabricating the heat dissipation and spreading apparatus 10, the upper and lower film layers 12a,12b are placed against one another and are suitably heat welded to one another, or otherwise sealed to one another, along (as viewed in FIG. 1) a right end edge portion 22, opposite long side edge portions 24 and 26, and spaced apart intermediate portions 28 (see also FIG. 2) parallel to the long side edge portions 24 and 28, to thereby form in the pad structure film body a spaced series of elongated parallel pockets 30 configured to receive the heat pipe tubes 16. The pockets 30 are laterally sealed and isolated from one another by the intermediate film body portions 28, are sealed at their right ends (as viewed in FIG. 1) by the sealed film body portion 22, but are open at their left ends (as viewed in FIG. 1) at a left end edge portion 32 of the film body portion.

The heat pipe tubes 16 are then rightwardly inserted into the film body pockets 30, through the open left ends thereof and are suitably saturated with an appropriate thermosyphoning heat transfer liquid—representatively purified water. A partial vacuum is then appropriately created in the interiors of the pockets 30, and the inserted liquid-saturated tubes 16 are then sealed. within their partially evacuated pockets 30 by sealing the remaining unsealed end edge 32 of the film body of the heat spreading pad structure 12. The partial vacuum within the now sealed pockets 30 causes the arcuate film sections i.e., the indicated sections 12a' and their bottom side counterparts shown in FIG. 2) to tightly conform to the outer side surfaces of their associated tubes 16.

To saturate the tubes 16 with their heat transfer liquid, and create and maintain the vacuum forces that tightly hold the film layers against the outer surfaces of the tubes in the completed pad structure 12, the tubes 16 may be inserted into the pockets 30 as previously described and then filled with the heat transfer liquid prior to the sealing of the left end edge 32 of the film body. The partially completed and as yet unsealed pad structure is then heated to a temperature sufficient to evaporate away a substantial portion of the liquid and leave the tubes 16 in their desired liquid-saturated state. This is preferably achieved by submerging the open pad end in a bath of the working fluid during the application of heat. Finally, the left end edge 32 of the film body is sealed (while heat is being applied and before removal from the bath), and the now sealed pad structure 12 is allowed to cool. This cooling creates the desired partial vacuum within the film body pockets 30.

Figure 3:
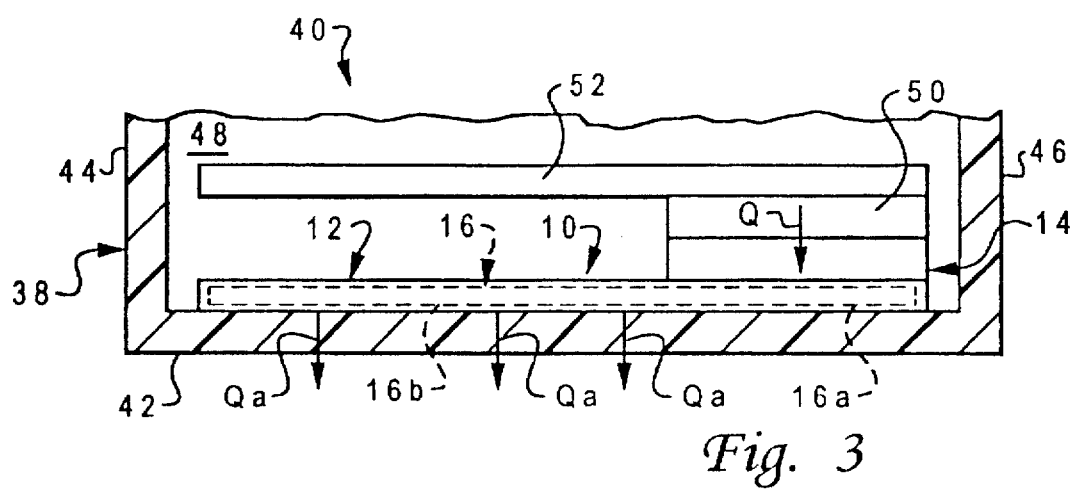
FIG. 3 is a simplified, somewhat schematic cross-sectional view taken through a representative portable computer and illustrating the heat dissipation pad structure being used to remove heat from a processor portion of the computer.

Cross-sectionally depicted in highly schematic form in FIG. 3 is the base housing portion 38 of a representative portable notebook computer 40 in which the heat dissipation and spreading apparatus 10 of the present invention is illustratively incorporated. Base housing 38 has a bottom side wall 42, opposite upstanding left and right end walls 44 and 46, and opposite upstanding front and rear side walls, with only the rear side wall 48 being shown in FIG. 3. operatively disposed within the interior of the base housing 38 is a heat generating electronic component—representatively a processor 50 depending from the underside of a printed circuit board 52 parallel to and spaced upwardly apart from the base housing bottom side wall 42.

The heat dissipation and spreading apparatus 10 underlies the printed circuit board 52, with the bottom film layer 12b resting atop the interior top side surface of the bottom base housing wall 42, thereby being in a heat transfer relationship therewith. As illustrated, the top side of the metal heat receiving block 14 upwardly engages the bottom side of the processor 50, thereby being in a heat transfer relationship therewith.

With continuing reference to FIG. 3, during operation of the computer 40, heat Q generated by the processor 50 is conducted downwardly through the metal heat receiving block 14, through the top film layer 12a and into right end portions 16a of the vacuum-encapsulated heat pipe tubes 16. The heat received by the right end portions 16a of the tubes 16 causes heat transfer liquid carried in their porous wall portions to be vaporized, forced into the hollow interiors of the right tube end portions 16a, and then be forced in vapor form through the interiors of the remaining left longitudinal portions 16b of the tubes.

As this vaporized heat transfer liquid leftwardly traverses the interiors of the left longitudinal tube portions 16b, it transfers portions Qa of the originally received heat Q to the bottom base housing wall 42 for outward dissipation therefrom as indicated. The spreading and outward dissipation of the heat portions Qa cools and condenses the leftwardly flowing vapor within the tube interiors, with the condensed liquid being absorbed into the porous side walls of the tube portions 16b and, by a capillary or "wicking" action returned rightwardly through such porous wall portions to their right ends 16a to again receive the main heat flow Q being generated by the processor 50. In this manner a thermosyphoning action is used to spread and dissipate the heat Q along and outwardly through the base housing bottom wall 42.

Various modifications can be made to the heat dissipation and spreading apparatus 10 without departing from the spirit and scope of the present invention. For example, while the block 14 facilitates the introduction of the electronic component heat Q into the pad structure 12, the block 14 could be eliminated and the component 50 be positioned directly against a portion of the pad structure 12 if desired.

Additionally, while the tubes 16 have been shown as being formed from a porous plastic material, they could be alternatively formed from another suitable "wicking" material such as, for example, a fibrous structure, a partially fused plastic beading material, or some other similar wicking material. The wicking tube structure is preferably flexible enough to avoid breakage and to deform to fit the items to be cooled.

The depicted elongated rectangular shape of the heat spreading pad structure 12 is, of course, merely representative, and can be changed to suit the particular heat spreading and dissipation application at hand. Moreover, while the tubes 16 have been illustratively shown as being straight and parallel to one another, they need not be either straight or parallel to one another—they may have nonlinear configurations and/or nonparallel relationships as needed by the particular heat dissipation and spreading application.

Also, while the tubes have been illustrated as having circular cross-sections along their lengths, they could alternatively have other cross-sectional shapes if desired. In the preferred embodiment of the present invention the apparatus 10 includes the illustrated pad structure 12 formed from a plurality of encapsulated heat pipe structures. However, as will be readily appreciated by those of skill in this particular art, the invention also provides a technique for forming a single heat pipe structure if desired.

Using the fabrication method described above, the present invention provides an efficient yet relatively inexpensive thermosyphoning heat pipe-based heat dissipation and spreading apparatus which is useful in conjunction with a heat generating electronic component such as an electronic component in a computer. However, the apparatus can also be used to substantial advantage in receiving, spreading and dissipating heat generated from other types of sources with which the apparatus may be placed in a suitable heat transfer relationship.

The foregoing detailed description is to be clearly understood as being given by way of illustration and example only, the spirit and scope of the present invention being limited solely by the appended claims.

What is claimed is:

1. Heat transfer apparatus comprising:
   a hollow tubular member formed from a wicking material and having a quantity of a heat transfer fluid therein; and
   a pocket structure formed from a flexible sheet material and sealingly encapsulating said hollow tubular member, the interior of said pocket structure being at least partially evacuated in a manner forcibly holding said flexible sheet material exteriorly against said hollow tubular member in configurational conformance with its exterior shape.

2. The heat transfer apparatus of claim 1 wherein:
   said hollow tubular member is resiliently deformable along its length.

3. The heat transfer apparatus of claim 1 wherein:
   said wicking material is a porous plastic material.

4. The heat transfer apparatus of claim 1 wherein:
   said hollow tubular member has a generally circular cross-section along its length.

5. The heat transfer apparatus of claim 1 wherein:
   said flexible sheet material is a plastic film material.

6. The heat transfer apparatus of claim 1 wherein:
   said flexible sheet material is a high temperature polyimide film material.

7. The heat transfer apparatus of claim 1 wherein:
   said heat transfer fluid is water.

8. Apparatus for receiving heat from a heat generating object in a first portion thereof, and spreading and dissipating the received heat through and from a second portion thereof, said apparatus comprising a pad structure including:
   a spaced plurality of hollow tubular members each being formed from a wicking material and having a quantity of a heat transfer fluid therein; and
   a pad body formed from a flexible sheet material and having a plurality of sealed pocket areas formed therein,
      each of said sealed pocket areas receiving a different one of said hollow tubular members and being at least partially evacuated in a manner holding the flexible sheet material exteriorly against the hollow tubular member in configurational conformance with its exterior shape.

9. The apparatus of claim 8 wherein:
   said hollow tubular members are resiliently deformable along their lengths.

10. The apparatus of claim 8 wherein:
    said spaced plurality of hollow tubular members have generally straight configurations, and are in a parallel, laterally facing arrangement.

11. The apparatus of claim 8 wherein:
    said wicking material is a porous plastic material.

12. The apparatus of claim 8 wherein:
    said hollow tubular members have generally circular cross-sections along their lengths.

13. The apparatus of claim 8 wherein:
    said flexible sheet material is a plastic film material.

14. The apparatus of claim 8 wherein:
    said flexible sheet material is a high temperature polyimide film material.

15. The apparatus of claim 8 wherein:
    said heat transfer fluid is water.

16. The apparatus of claim 8 further comprising:
    a thermally conductive heat receiving member positionable against a portion of one side of said pad structure, and against the heat generating object, to facilitate heat transfer from the heat generating object into said pad structure.

17. The apparatus of claim 16 wherein:
    said heat receiving member is a metal heat receiving block member.

18. Apparatus for receiving heat from a heat generating object in a first portion thereof, and spreading and dissipating the received heat through and from a second portion thereof, said apparatus comprising a pad structure including:
- a spaced plurality of hollow tubular members each being formed from a wicking material and having a quantity of a heat transfer fluid therein;
- a pad body formed from a flexible sheet material and having a plurality of sealed pocket areas formed therein,
  - each of said sealed pocket areas receiving a different one of said hollow tubular members and being at least partially evacuated in a manner holding the flexible sheet material exteriorly against the hollow tubular member in configurational conformance with its exterior shape; and
- a thermally conductive heat receiving member positionable against a portion of one side of said pad structure, and against the heat generating object, to facilitate heat transfer from the heat generating object into said pad structure,
  - said heat receiving member having a side surface with spaced indentations formed therein and configured to complementarily receive lateral portions of the encapsulated hollow tubular members.

19. Electronic apparatus comprising:
a hollow housing having an exterior wall;
a heat generating component disposed within said housing; and
a heat transfer pad structure for receiving heat from said component, spreading the received heat and transferring it to said exterior housing wall, said pad structure having a first portion in heat transfer communication with said component, and a second portion in heat transfer communication with said exterior housing wall, said heat transfer pad structure including:
- a spaced plurality of hollow tubular members each being formed from a wicking material and having a quantity of a heat transfer fluid therein, and
- a pad body formed from a flexible sheet material and having a plurality of sealed pocket areas formed therein, each of said sealed pocket areas receiving a different one of said hollow tubular members and being at least partially evacuated in a manner holding the flexible sheet material exteriorly against the hollow tubular member in configurational conformance with its exterior shape.

20. The electronic apparatus of claim 19 wherein:
said electronic apparatus is a computer.

21. The electronic apparatus of claim 20 wherein:
said heat generating component is a processor.

22. The electronic apparatus of claim 20 wherein:
said computer is a portable computer.

23. The electronic apparatus of claim 22 wherein:
said portable computer is a notebook computer.

24. The electronic apparatus of claim 19 wherein:
said hollow tubular members are resiliently deformable along their lengths.

25. The electronic apparatus of claim 19 wherein:
said spaced plurality of hollow tubular members have generally straight configurations, and are in a parallel, laterally facing arrangement.

26. The electronic apparatus of claim 19 wherein:
said wicking material is a porous plastic material.

27. The electronic apparatus of claim 19 wherein:
said hollow tubular members have generally circular cross-sections along their lengths.

28. Electronic apparatus comprising:
a hollow housing having an exterior wall;
a heat generating component disposed within said housing; and
a heat transfer pad structure for receiving heat from said component, spreading the received heat and transferring it to said exterior housing wall, said pad structure having a first portion in heat transfer communication with said component, and a second portion in heat transfer communication with said exterior housing wall, said heat transfer pad structure including:
- a spaced plurality of hollow tubular members each being formed from a wicking material and having a quantity of a heat transfer fluid therein, and
- a pad body formed from a flexible sheet material and having a plurality of sealed pocket areas formed therein, each of said sealed pocket areas receiving a different one of said hollow tubular members and being at least partially evacuated in a manner holding the flexible sheet material exteriorly against the hollow tubular member in configurational conformance with its exterior shape, said flexible sheet material being a plastic film material.

29. Electronic apparatus comprising:
a hollow housing having an exterior wall;
a heat generating component disposed within said housing; and
a heat transfer pad structure for receiving heat from said component, spreading the received heat and transferring it to said exterior housing wall, said pad structure having a first portion in heat transfer communication with said component, and a second portion in heat transfer communication with said exterior housing wall, said heat transfer pad structure including:
- a spaced plurality of hollow tubular members each being formed from a wicking material and having a quantity of a heat transfer fluid therein, and
- a pad body formed from a flexible sheet material and having a plurality of sealed pocket areas formed therein, each of said sealed pocket areas receiving a different one of said hollow tubular members and being at least partially evacuated in a manner holding the flexible sheet material exteriorly against the hollow tubular member in configurational conformance with its exterior shape, said flexible sheet material being a high temperature polyimide film material.

30. The electronic apparatus of claim 19 wherein:
said heat transfer fluid is water.

31. Electronic apparatus comprising:
a hollow housing having an exterior wall;
a heat generating component disposed within said housing;
a heat transfer pad structure for receiving heat from said component, spreading the received heat and transferring it to said exterior housing wall, said pad structure having a first portion in heat transfer communication with said component, and a second portion in heat transfer communication with said exterior housing wall, said heat transfer pad structure including:
- a spaced plurality of hollow tubular members each being formed from a wicking material and having a quantity of a heat transfer fluid therein, and a pad body formed from a flexible sheet material and having a plurality of sealed pocket areas formed therein, each of said sealed pocket areas receiving a different one of said hollow tubular members and being at least partially evacuated in a manner holding the flexible sheet material exteriorly against the hollow tubular member in configurational conformance with its exterior shape; and a thermally conductive heat receiving member positioned against a portion of one side of said pad structure, and against said heat generating component, to facilitate heat transfer from said heat generating component into said pad structure.

32. The electronic apparatus of claim 31 wherein:

the opposite side of said pad structure is positioned directly against said exterior housing wall.

33. The electronic apparatus of claim 31 wherein:

said heat receiving member is a metal heat receiving block member.

34. The electronic apparatus of claim 31 wherein:

said heat receiving member has a side surface with spaced indentations formed therein and complementarily receiving lateral portions of the encapsulated hollow tubular members.

35. A method of fabricating a heat transfer structure comprising the steps of:

providing a hollow tubular member formed from a wicking material;

placing a quantity of a heat transfer fluid in said hollow tubular member;

providing a pocket structure formed from a flexible sheet material;

sealingly encapsulating said hollow tubular member within said pocket structure; and creating at least a partial vacuum within the interior of said pocket structure in a manner forcing and holding said flexible sheet material exteriorly against said hollow tubular member in configurational conformance with its exterior shape.

36. A method of fabricating a heat transfer structure comprising the steps of:

providing a hollow tubular member formed from a wicking material;

placing a quantity of a heat transfer fluid in said hollow tubular member;

providing a pocket structure formed from a flexible sheet material;

sealingly encapsulating said hollow tubular member within said pocket structure; and creating at least a partial vacuum within the interior of said pocket structure in a manner forcing and holding said flexible sheet material exteriorly against said hollow tubular member in configurational conformance with its exterior shape, said creating step being performed prior to said sealingly encapsulating step.

37. A method of fabricating a heat transfer structure comprising the steps of:

providing a hollow tubular member formed from a wicking material;

placing a quantity of a heat transfer fluid in said hollow tubular member;

providing a pocket structure formed from a flexible sheet material;

sealingly encapsulating said hollow tubular member within said pocket structure;

creating at least a partial vacuum within the interior of said pocket structure in a manner forcing and holding said flexible sheet material exteriorly against said hollow tubular member in configurational conformance with its exterior shape; and heating said hollow tubular member, said quantity of heat transfer fluid and said pocket structure prior to performing said sealingly encapsulating step, said creating step being performed after said sealingly encapsulating step by permitting the heated hollow tubular member, heat transfer fluid and pocket structure to cool.

38. A method of fabricating a heat transfer structure comprising the steps of:

providing a pad body formed from a flexible sheet material and having a spaced plurality of hollow pocket areas therein;

placing a plurality of hollow tubular members in said pocket areas, said hollow tubular members being formed from a wicking material;

placing a quantity of a heat transfer fluid in each of said hollow tubular members;

sealingly encapsulating said hollow tubular members within said pocket areas; and creating in the interior each of said pocket areas at least a partial vacuum in a manner forcing and holding its flexible sheet material exteriorly against its associated hollow tubular member in configurational conformance with its exterior shape.

39. A method of fabricating a heat transfer structure comprising the steps of:

providing a pad body formed from a flexible sheet material and having a spaced plurality of hollow pocket areas therein;

placing a plurality of hollow tubular members in said pocket areas, said hollow tubular members being formed from a wicking material;

placing a quantity of a heat transfer fluid in each of said hollow tubular members;

sealingly encapsulating said hollow tubular members within said pocket areas; and creating in the interior each of said pocket areas at least a partial vacuum in a manner forcing and holding its flexible sheet material exteriorly against its associated hollow tubular member in configurational conformance with its exterior shape, said creating step being performed prior to said sealingly encapsulating step.

40. A method of fabricating a heat transfer structure comprising the steps of:

providing a pad body formed from a flexible sheet material and having a spaced plurality of hollow pocket areas therein;

placing a plurality of hollow tubular members in said pocket areas, said hollow tubular members being formed from a wicking material;

placing a quantity of a heat transfer fluid in each of said hollow tubular members;

sealingly encapsulating said hollow tubular members within said pocket areas;

creating in the interior each of said pocket areas at least a partial vacuum in a manner forcing and holding its flexible sheet material exteriorly against its associated hollow tubular member in configurational conformance with its exterior shape; and heating said hollow tubular members, said quantities of heat transfer fluid and said pad body prior to performing said sealingly encapsulating step, said creating step being performed after said sealingly encapsulating step by permitting the heated hollow tubular members, quantities of heat transfer fluid and pad body to cool.

* * * * *